United States Patent [19]
Chapman

[11] Patent Number: 5,268,813
[45] Date of Patent: Dec. 7, 1993

[54] FLEXIBLE PRINTED CIRCUIT PACKAGE AND FLEXIBLE PRINTED CIRCUIT FOR INCORPORATING IN SUCH A PACKAGE

[75] Inventor: Sydney G. Chapman, Winchester, United Kingdom

[73] Assignee: International Business Machines Corp., Armonk, N.Y.

[21] Appl. No.: 802,106

[22] Filed: Dec. 4, 1991

[30] Foreign Application Priority Data

Dec. 12, 1990 [GB] United Kingdom ............. 90313534

[51] Int. Cl.5 .................... H05K 7/20; H05K 1/00
[52] U.S. Cl. .................................................. 361/704
[58] Field of Search ............... 174/252, 254-255; 361/383, 386-389, 398, 400

[56] References Cited

U.S. PATENT DOCUMENTS

| | | | |
|---|---|---|---|
| 3,873,889 | 3/1975 | Leyba | 361/398 |
| 4,489,364 | 12/1984 | Chance et al. | 361/409 |
| 4,680,675 | 7/1987 | Sato | 174/254 |
| 5,065,280 | 11/1991 | Karnezos et al. | 361/388 |

FOREIGN PATENT DOCUMENTS 2262729 4/1974 Fed. Rep. of Germany .
2344203 3/1976 France ............ 361/398
1048021 2/1963 United Kingdom .

OTHER PUBLICATIONS

Franck et al, "Microcircuit Module And Connector" IBM Tech. Discl. Bulletin, vol. 13, No. 7, Dec. 1970, pp. 1786-1787.
WO 85/05756 (PCT), Ocken et al, Multiple Planar Heat Sink, Dec. 1985.

*Primary Examiner*—Gregory D. Thompson
*Attorney, Agent, or Firm*—Bernard Tiegerman

[57] ABSTRACT

A circuit package is disclosed including a flexible printed circuit (10) which overlies, and follows the contour of, a carrier (50) having a substantially zig-zag shaped surface. The flexible printed circuit of this circuit package is in the form of a tape having a periodic, modular wiring pattern extending along the length of the tape, with connection lands provided between adjacent wiring modules. The circuit package also includes a plug for maintaining the flexible printed circuit in place on the carrier. Circuit components (20) mounted on the flexible printed circuit abut planar portions of the zig-zag shaped surface of the carrier (50).

5 Claims, 1 Drawing Sheet

FLEXIBLE PRINTED CIRCUIT PACKAGE AND FLEXIBLE PRINTED CIRCUIT FOR INCORPORATING IN SUCH A PACKAGE

BACKGROUND OF THE INVENTION

1. Field of the Invention

The invention relates to electronic circuits and in particular to the condensed packaging of printed electronic circuits. The invention finds particular, but not exclusive application to the packaging of memory circuits in a circuit assembly.

2. Description of the Related Art

The trend in manufacturing of electronic equipment is to reduce the physical size of electronic circuits and electronic components while at the same time improving their performance and capability. Conventionally, electronic circuits, such as electronic memory circuits, have been mounted on rigid boards. This has meant that applications requiring a large amount of circuitry have also been mounted on large rigid boards which occupy a large amount of volume within the housing unit. The housing unit is the external cover of a computer or other electronic apparatus.

All electronic circuits generate heat while in operation and require cooling to keep them at optimum working conditions. Very often the cooling of circuit components is only achieved by the addition of further elements such as a heatsink block to conduct heat away from the components. Heatsink blocks also tend to occupy large volumes of space within housing units.

The compact packaging of electronic circuits is not easily achieved because of the considerations which have to be made to cool the circuit components.

SUMMARY OF THE INVENTION

The invention provides a means of reducing the volume occupied by electronic circuits without compromising on cooling provisions.

A circuit package, according to the invention, comprises a flexible printed circuit and a carrier having a substantially zig-zag shaped surface, the flexible printed circuit overlying and following the zig-zag shaped surface, and a support for maintaining the flexible printed circuit in place on the carrier with components mounted on the flexible printed circuit abutting planar surfaces of the carrier.

The invention also provides a flexible printed circuit tape for incorporating into such a package. Printed circuit wires are provided on the tape for interconnecting components mounted along the length of the tape, said wires being terminated at input/output connection tabs situated at the end or ends of the tape.

By mounting an electronic circuit, such as a memory circuit, on a flexible tape and folding it to follow the contours of a zig-zag shaped surface of a carrier, the area which would have been occupied by the same circuit mounted flat on a rigid board is reduced. By making the carrier from a thermally conductive material, the carrier acts as a heat sink for the components.

Such a printed circuit tape has the input and output connections to the circuit components located only at the ends of the tape or indeed only at one end of the tape. The interconnecting wiring from one component to the next along the tape is provided in the form of modular wiring pattern which is replicated throughout the length of the flexible tape. For memory applications this enables lengths of tape to be cut off as required.

BRIEF DESCRIPTION OF THE DRAWINGS

The invention is described with reference to the accompanying drawings, wherein.

DETAILED DESCRIPTION OF THE PREFERRED EMBODIMENTS

Figure 1:
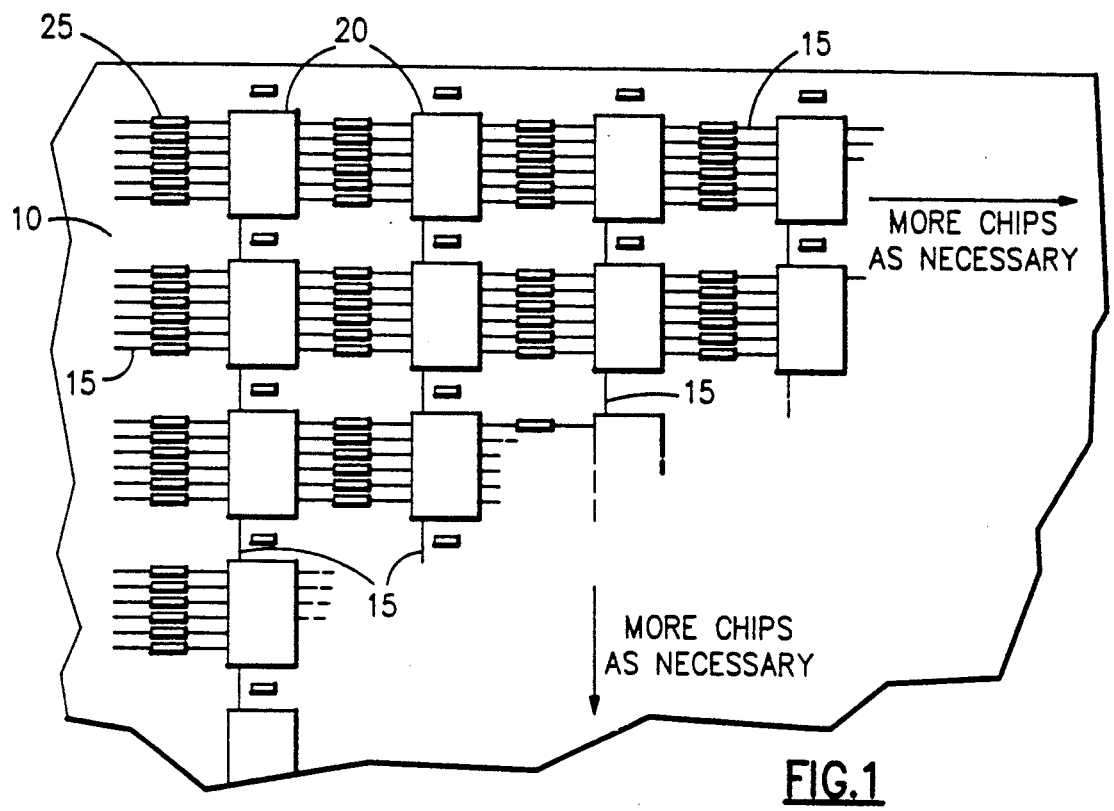
FIG. 1 is a plan view of connections between memory chips mounted on a flexible printed circuit.

FIG. 1 shows a portion of a flexible printed circuit tape 10 carrying a plurality of memory chips 20 arranged in rows and columns and interconnected to form a memory circuit. The circuit components are mounted by Direct Chip Attachment technology to preserve the flexibility of the tape. Memory circuits such as the one shown in FIG. 1 are particularly suitable for packaging according to the present invention because the circuit is constructed from equally sized memory chips 20 which lend themselves readily to being arranged in rows and columns on the flexible tape 10. The flexible tape is continuous and the wiring pattern 15 interconnecting the memory chips is replicated identically throughout its length so that the tape is hypothetically arranged in frames, each frame being substantially identical and having a known memory size.

The width of the tape can be designed to accommodate various memory configurations and various word widths as is indicated in FIG. 1. The wiring pattern 15 providing the input and output connections to the chips is identical from chip to chip and extends from one end of the tape to the other. Contact lands 25 are located between chips along the length of the tape. Memory circuits of required capacity are obtained simply by cutting off lengths of tape carrying appropriate numbers of memory chips. In this embodiment the circuitry is arranged in parallel data communication so that the number of input and output connections is relatively small. The total number of interconnecting lines can also be minimized by using common input/output lines, the input and output lines may all terminate at one end of the flexible tape or alternatively the input and output connections could occur on the opposite edges of the tape from one another. Many variations of interconnection wiring exist.

The lengths of flexible tape are severed at the position so the contact lands 25 in order to preserve the means of connecting the individual lengths to external circuitry.

Figure 2:
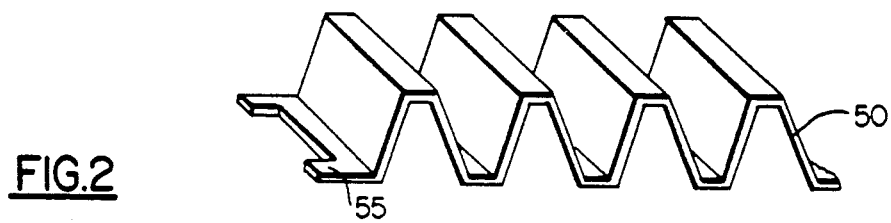
FIG. 2 shows a zig-zag shaped carrier for the flexible printed circuit.

FIG. 2 shows a printed circuit carrier 50 formed from aluminium sheet material folded in a zig-zag shape.

Figure 3:
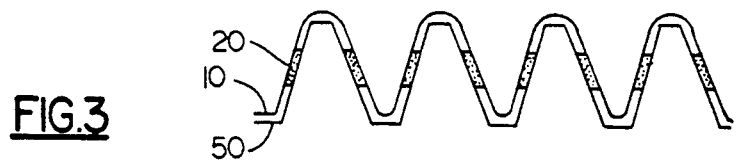
FIG. 3 schematically shows the flexible printed circuit overlying the carrier with component chips mounted on the printed circuit abutting planar surfaces of the carrier.

FIG. 3 schematically shows the flexible tape 10 in position against the carrier 50 so that it overlies and follows the zig-zag shape with the back of the memory chips 20 in intimate contact abutting planar surfaces of the carrier.

The assembled carrier and tape can be further condensed by being compressed longitudinally in a concertina like manner, greatly reducing the area normally required by such a circuit.

The relatively rigid carrier, being constructed from a material having a high thermal conductivity, acts as a heat sink for the memory chips.

The carrier 50 has tabs 55 at its ends for attachment to a circuit board (not shown). The memory circuit lands 25 at the ends of the tape are available for electrical connection to the circuit board.

Figure 4:
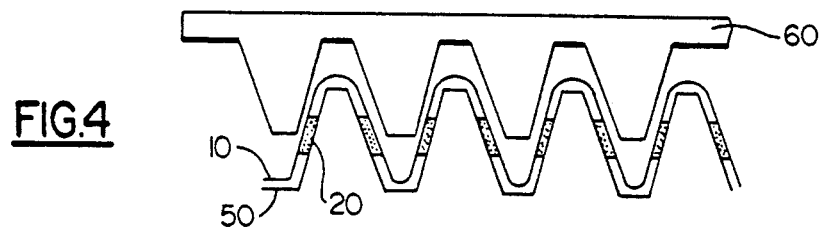
FIG. 4 schematically shows a resilient plug support for maintaining the flexible printed circuit in place on the carrier.

FIG. 4 schematically shows the tape 10 is held in place on the carrier 50 with the chips in close thermal contact with planar portions of the zig-zag carrier surface. FIG. 4 also indicates the positioning of a non-conducting resilient plug 60 of complementary shape. The plug is made of soft rubber or plastic and stays in position when squeezed between the folds of the flexible tape. The plug, flexible tape and carrier can be held in contact by external means. The plug of insulating material also serves to 1 prevent unwanted shorting between metallizations on the folded tape.

The preferred embodiment described above utilizes a zig-zag shaped carrier made from formed aluminium sheet into which a flexible printed circuit tape is folded with memory chips carried by the tape abutting the planar surfaces of the carrier. A resilient rubber plug of complementary shape is pressed into the V-shaped spaces of the carrier holding the tape in place with the memory chips in intimate thermal contact with the carrier.

It will be clear however that many variations exist. For example, the carrier could have a zig-zag surface on one side and be planar on the other, the greater mass of material providing a larger heat sink or the retaining plug could be replaced by other support means such as a further complementary zig-zag shaped member which mates with the shape of the carrier. Conventionally a memory circuit package made in accordance with the present invention would be mounted horizontally on a printed circuit board of a computer. Where the input and output connections are all at the same end of the tape, the package can be mounted vertically to the board of a circuit assembly, thus leaving valuable space on the board for other circuit components.

Packaging circuits in this way is a low cost way of saving space which makes no concessions on cooling provisions. It is particularly useful in portable computers where space is at a premium. The invention is particularly applicable to memory circuits but can be applied equally to printed circuits carrying other components, even circuits in which the components are all the same size. Since the plug 60 can be removed and replaced at will, the circuit package allows for easy access to the chips.

I claim:

1. A circuit package comprising:
    a flexible printed circuit and a carrier having a substantially zig-zag shaped surface, the flexible printed circuit overlying and following the zig-zag shaped surface of the carrier with circuit components mounted on the flexible printed circuit abutting planar portions of the zig-zag shaped surface of the carrier; and
    means for maintaining the flexible printed circuit in place on the carrier, said means including a plug having a substantially zig-zag shaped surface complementary to the zig-zag shaped surface of the carrier, said plug being adapted to mate with the carrier so as to retain the flexible printed circuit in place on the carrier and to maintain the components in intimate contact with the carrier.

2. A circuit package as claimed in claim 1 wherein the plug is made from a non-conducting, resilient material.

3. A circuit package as claimed in claim 1 wherein said carrier is formed form thermally conducting material so as to provide a heatsink for the circuit components.

4. A circuit package as claimed in claim 5 wherein said carrier thermally conducting material includes sheet aluminium.

5. A circuit package as claimed in claim 1 wherein said flexible printed circuit is in the form of an elongated tape and said circuit components are memory chips mounted along the length of the tape.

* * * * *